United States Patent
Kimizuka

[11] Patent Number: 6,013,577
[45] Date of Patent: Jan. 11, 2000

[54] METHOD OF MAKING AN AMORPHOUS SURFACE FOR A GATE ELECTRODE DURING THE FABRICATION OF A SEMICONDUCTOR DEVICE

[75] Inventor: Naohiko Kimizuka, Tokyo, Japan

[73] Assignees: NEC Corporation; Tetsuya Muraoka, both of Tokyo, Japan

[21] Appl. No.: 09/014,467

[22] Filed: Jan. 28, 1998

[30] Foreign Application Priority Data

Feb. 3, 1997 [JP] Japan .................................. 9-019552

[51] Int. Cl.[7] .............................. H01L 21/44; H01L 29/76
[52] U.S. Cl. .............................. 438/659; 257/52; 257/338
[58] Field of Search .................................. 438/451, 485, 438/228, 305, 659; 257/347, 348, 369, 408, 457, 52, 274

[56] References Cited

U.S. PATENT DOCUMENTS

| | | | |
|---|---|---|---|
| 4,697,333 | 10/1987 | Nakahara | 438/305 |
| 4,728,619 | 3/1988 | Pfiester et al. | 438/451 |
| 5,036,019 | 7/1991 | Yamane et al. | 438/228 |
| 5,541,131 | 7/1996 | Yoo et al. | 438/305 |

FOREIGN PATENT DOCUMENTS

61 191070 of 0000 Japan .

*Primary Examiner*—Wael Fahmy
*Assistant Examiner*—William David Coleman
*Attorney, Agent, or Firm*—J. Warren Whitesel; Laff, Whitesel & Saret, Ltd.

[57] ABSTRACT

To prevent channelling of gate impurities into channel region or gate insulation film without restricting sidewall material of the gate electrodes, a fabrication method of the invention of semiconductor devices comprises a first ion injection step for making amorphous a surface region (11) of a poly-silicon layer (7) for a gate electrode configured on a semiconductor substrate (1) by injecting ions selectively into the surface region, and a second ion injection step, performed after the first ion injection step without inserting any process needing a high temperature of the semiconductor substrate, for injecting impurities into the gate electrode.

12 Claims, 8 Drawing Sheets

METHOD OF MAKING AN AMORPHOUS SURFACE FOR A GATE ELECTRODE DURING THE FABRICATION OF A SEMICONDUCTOR DEVICE

BACKGROUND OF THE INVENTION

The present invention relates to a fabrication method of semiconductor devices, and particularly to a growth method of epitaxial layers for fabricating MOS (metal Oxide Semiconductor) transistors.

Seeking finer integration and higher performance of CMOS (Complementary MOS) LSI (Large Scale Integrated circuits), miniaturization of MOSFETs (MOS Field Effect Transistors) has been pursued, and MOSFETs having gate electrode of 0.25 μm are developed now. Along with the miniaturization of MOSFETs, innovation of gate electrode structure of the CMOS LSI is also required.

Conventionally, n-type semiconductor is used for gate electrodes of MOSFETs in the CMOS LSI regardless of difference of conductivity type, namely difference between nMOSFET (n-type MOSFET) and pMOSFET (p-type MOSFET), because of convenience in their fabrication processes. For example, just after configuring a gate insulation film, a poly-crystal silicon layer is deposited and phosphorus diffusion is performed to obtain the n-type semiconductor for the gate electrodes. According to these fabrication processes, a buried-channel type pMOSFET having gate electrode of n-type semiconductor is obtained.

However, the short-channel-effect becomes dominant in the buried-type pMOSFET, which causes a problem that the threshold voltage is highly affected from gate length dispersion accompanying the fabrication processes. This threshold voltage dispersion makes circuit operation unstable and restricts circuit design of the CMOS LSI, without saying of yield-rate degradation.

For evading this problem, threshold voltage is heretofore designed to be certainly high in the pMOSFET according to the conventional fabrication processes. However, in the CMOS LSI being developed now, which has MOSFETs of gate electrodes shorter than 0.25 μm, power supply voltage is to be set under 2.5V instead of former standard of 5V or 3.3V, the threshold voltage being forced to be designed lower than before.

This miniaturization of MOSFETs, and consequently, reduction of gate length and operation voltage should continue, needing further reduction of the threshold voltage. This is the reason that a practical fabrication method of the surface-channel type pMOSFET having a gate electrode of p-type semiconductor is waited now. In other words, the p-n gate CMOS LSI having nMOSFETs with n-type gate electrode and pMOSFETs with p-type gate electrode will be the main current hereafter.

However, for developing the above p-n gate CMOS LSI, it is inevitable to resolve following problems accompanying the impurity injection into the gate electrode.

In the p-n gate CMOS LSI, complementary gate electrodes have inverse conductivity with each other and cannot be injected with impurities by way of conventional methods such as phosphorus diffusion. Therefore, the gate electrodes are made active electrically by injecting impurity ions therein by way of an ion injection process performed when configuring source and drain electrodes of the MOSFETs. However, the injected impurity ions may often reach, by channelling, up to the gate insulation film or sometimes up to the channel region of the MOSFETs.

Results of an examination performed by us show that this channelling phenomenon is found predominantly in gate electrodes which are configured by patterning deposited and crystallized amorphous silicon, and it is confirmed that the channeling gives an abnormal kink on the sub-threshold characteristic curve of nMOSFET having gate length shorter than 0.5 μm.

It is also found that the abnormal kink is owing to column-like crystal grains formed in the amorphous silicon layer grown until the layer depth when the amorphous silicon layer is thermo-processed after deposition. Passing through boundaries of the crystal grains having orientation easy to be channelled, arsenic attains into a part of the channel region of the nMOSFETs when arsenic-ion injection process is performed afterwards for making active the gate electrodes.

The appearance of the abnormal kink in the sub-threshold characteristic is also deeply depending on the grain size, and it is when the grains, provoking the channelling of injected ions, show a bamboo-structure against the gate electrode that the abnormal kink is observed.

Prevention of the channeling is important because this phenomenon makes control of the MOSFET threshold voltage very difficult and degrades reliability of the gate insulation film as well.

Although it is not intending to configure the p-n gate structure, there is a prior art for preventing impurities to diffuse by channelling until the channel region in the ion injection process, by making amorphous the surface region of the injection object, which is disclosed in a Japanese patent application laid open as Provisional Publication No. 191070/'86.

FIGS. 18A to 18E are cross sections schematically illustrating fabrication processes of a semiconductor device disclosed in the above patent application.

Referring to FIGS. 18A to 18E, on a p-type substrate 21 having a separation region 22, a poly-crystal silicon layer 24 is deposited after forming an insulation film 23. After phosphorus diffusion, surface region 25 of the poly-crystal silicon layer 24 is made amorphous by silicon ion injection. After patterning of the gate electrode 26, $n^+$ and $n^-$ regions are formed by ion injection. Then, a sidewall 30 is configured by depositing a silicon-oxide layer and etching it back by way of anisotropic etching, which is followed by ion injection for introducing impurities into the gate electrode and configuring the source and the drain electrode.

Thus, the channelling of injected ions is suppressed in the prior art, by providing an amorphous region 25 on the surface of the gate electrode protected with a sidewall.

However, insulation materials to be used for configuring the sidewall 30 are limited within those which can be deposited at a temperature that may not cause re-crystallization of the amorphous silicon layer, in the prior art according to above processes. Practically saying, the applicable insulation material for configuring the sidewall is limited into either a low grade silicon-oxide film obtained from $O_3$/TEOS (tetra-ethoxy-silane) or a silicon-oxide film of insufficient step-coverage performance obtained from $O_2/SiH_4$.

When the silicon-oxide film is deposited with $O_3$/TEOS, it provokes degradation of hot-carrier life because of $H_2O$ included therein. When it is deposited with $O_2/SiH_4$, on the other hand, effective channel lengths of MOSFETs become unequal owing to dispersion of sidewall thickness depending on element layouts such as spaces between gate electrodes of the CMOS LSI, because of the bad step-coverage performance, resulting in instability of the device characteristic.

SUMMARY OF THE INVENTION

Therefore, a primary object of the present invention is to provide a fabrication method of gate electrodes of CMOS LSI wherein controllability of the threshold voltage and reliability of gate insulation film is improved by suppressing the channelling by making amorphous the surface region of the gate electrode, resolving the above prior problem at the same time, that is, without restricting the material of the gate electrode sidewall, in order to prevent increase of junction leak current because of crystal defects caused with injected ions attaining until the gate insulation film or the channel region when impurities are introduced by ion injection into the gate electrode.

In order to achieve the object, a fabrication method of semiconductor devices according to an embodiment of the invention comprises steps of;

configuring a gate electrode on a semiconductor substrate;

configuring a sidewall with an insulation film around the gate electrode;

configuring a silicon-nitride film on the semiconductor substrate together with the gate electrode surrounded by the sidewall;

configuring a silicon-oxide film on the silicon-nitride film, with a thickness more than a height of the gate electrode;

thinning out the silicon-oxide film so as to expose selectively the silicon-nitride film on a surface of the gate electrode; and making amorphous a surface region of the gate electrode by a first ion injection.

Hence, materials of a high quality and a good step-coverage performance such as silicon-nitride can be applied to the insulation film used for the sidewall. Therefore, thickness of the sidewall can be controlled independent of element layout such as spaces between gate electrodes, enabling uniformity of effective channel lengths of MOS-FETs and preventing pattern dependence of MOSFET characteristics such as threshold voltage, on-current or off-current values.

Another object of the invention is to provide the fabrication method of gate electrodes of CMOS LSI, wherein prevention of gate electrode depletion and configuration of shallow electrodes are both realized.

In the p-n gate CMOS LSI which will become the main current as previously described, junction depth of source and drain electrode should be made shallow without causing depletion of the gate electrode. In the surface-type MOSFET, introduction of impurities into the gate electrode is performed by way of the ion injection for configuring the source and drain electrodes. Therefore, when the ion injection is performed with low acceleration energy for configuring shallow junctions, impurity density of the gate electrode near the insulation film is left insufficient, resulting in insufficient drain current because of gate electrode depletion. When the injection energy is made high for preventing the depletion, the junction depth becomes deep, on the other hand, which enlarges the short-channel effect. Therefore, the realization of shallow junction without causing the gate electrode depletion is also intended in the semiconductor fabrication method of the invention for solving this tradeoff.

In order to achieve the above object, the above steps of the fabrication method of the embodiment are directly followed with steps of;

introducing first impurities into the gate electrode by a second ion injection;

removing the silicon-oxide film; and introducing second impurities giving the same conductivity with the first impurities into diffusion layer regions of the semiconductor substrate by a third ion injection for providing a source and a drain electrode.

Therefore, the impurity introduction into the gate electrode can be controlled by the second ion injection separately from that into the diffusion layer regions for the source and the drain electrode, enabling to prevent the gate electrode depletion and the shallow junctions at the same time.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

FIGS. 1 to 12 are cross sections illustrating fabrication processes of a pair of CMOSFETs according to a first embodiment of the invention.

Figure 1:
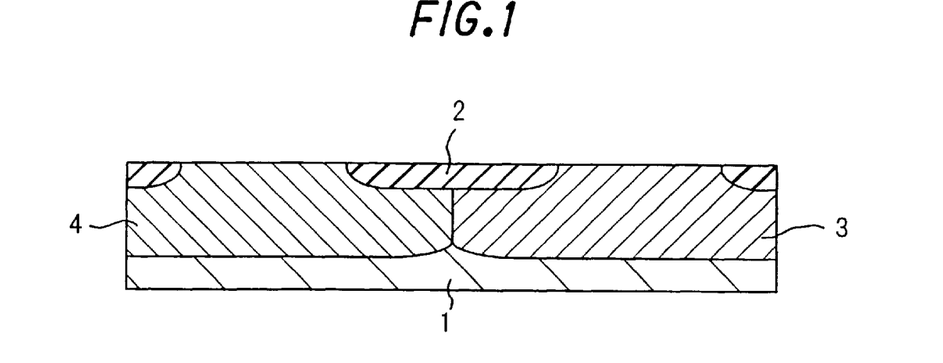
FIGS. 1 to 12 are cross sections illustrating fabrication processes of a pair of CMOSFETs according to a first embodiment of the invention.

For the first, field oxidation films 2 are configured on a semiconductor substrate 1 by way of LOCO (LOCal Oxidation of Silicon) method. Then, an ion injection follows making use of lithography technique for forming an n-well 3 and a p-well 4, as illustrated in FIG. 1.

Figure 2:
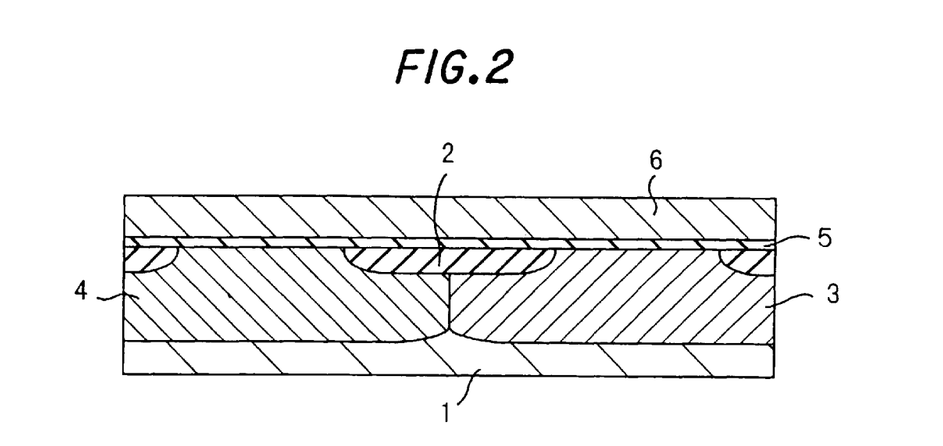
Figure 3:
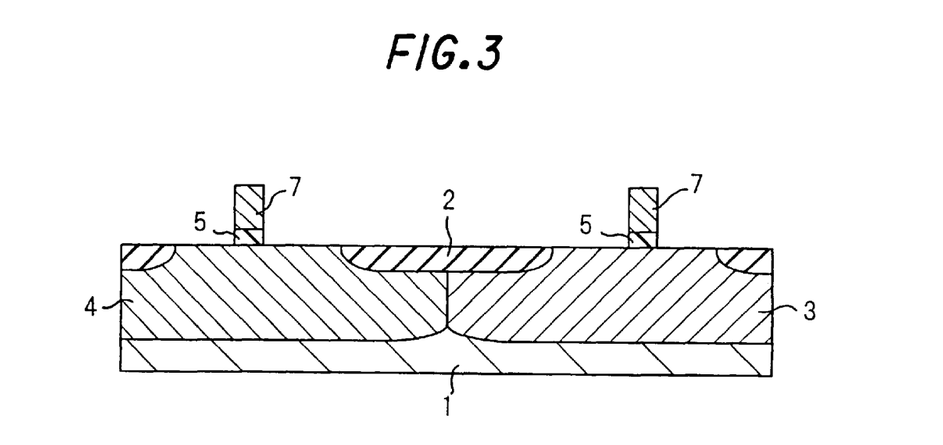

Then, after providing a gate oxidation film 5 of 6 mm, for example, a poly-silicon film 6 of 200 nm depth is deposited on whole surface of the substrate as illustrated in FIG. 2, wherefrom gate electrodes 7 are configured as illustrated in FIG. 3 by lithography and etching technology.

Figure 4:
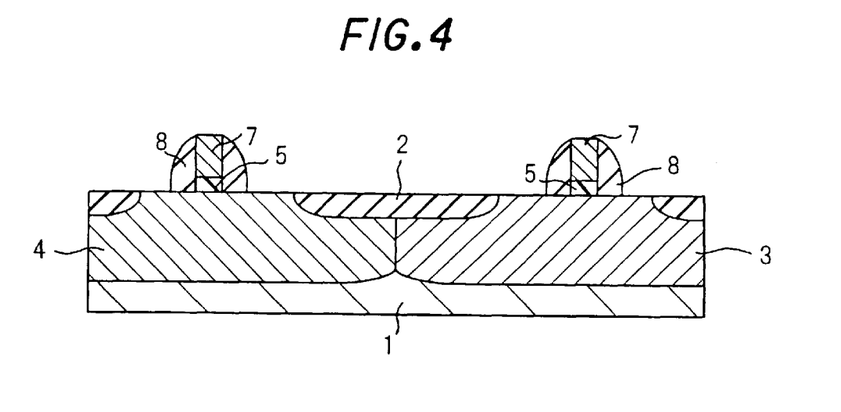

Then, a first silicon-nitride film is deposited and etched back for configuring sidewalls 8 around the gate electrodes 7, as illustrated in FIG. 4.

Figure 5:
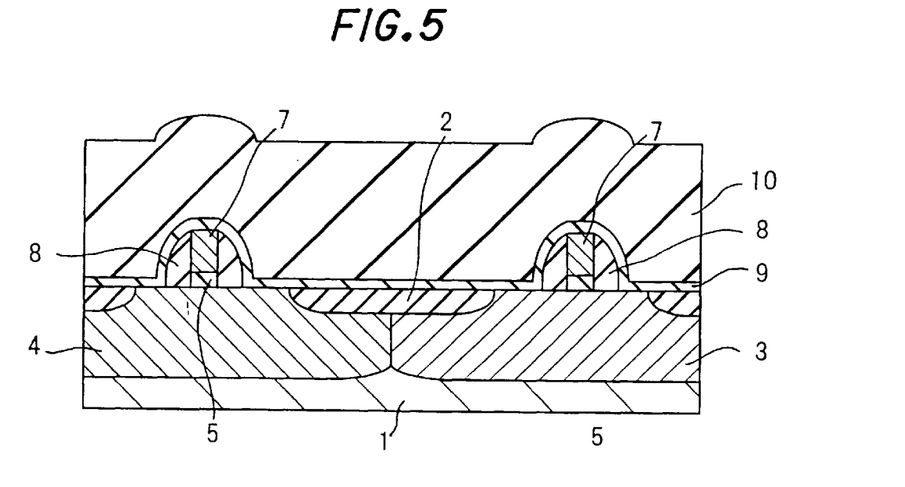

Then, a second silicon-nitride film 9 of 10 nm thickness is deposited on the whole substrate surface, which is followed by deposition of silicon-oxide film 10 of 400 nm depth laminated thereon, as illustrated in FIG. 5.

Figure 6:
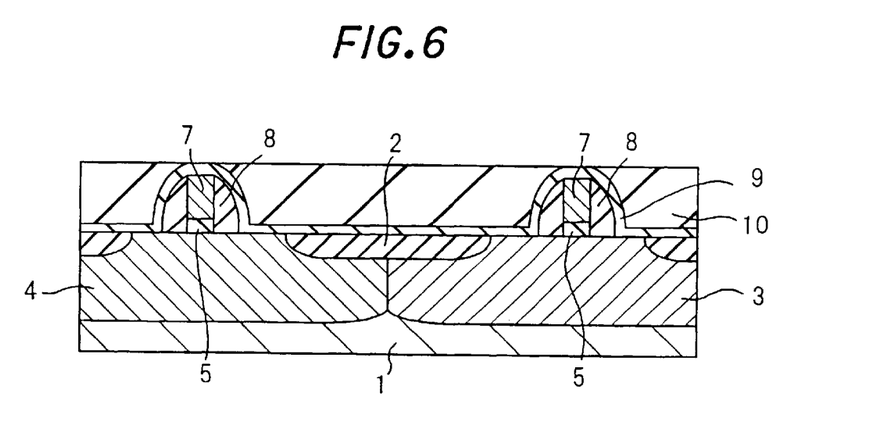

Then, the silicon-oxide film 10 is thinned out by CMP (Chemical Mechanical Polishing) until parts of the second silicon-nitride film 9 is exposed on the gate electrodes 7, as illustrated in FIG. 6.

Figure 7:
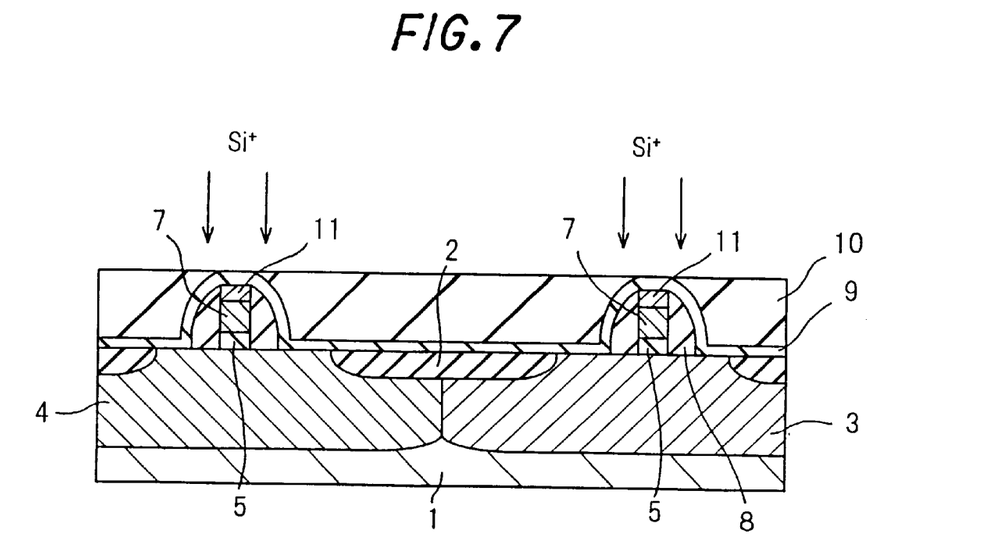

Then, as shown in FIG. 7, silicon-ion injection is performed under condition of acceleration energy of 40 KeV and dose amount of $1.0E15/cm^2$. By this process, amorphous silicon layers 11 of 90 nm thickness are formed under the surface of the gate electrodes. Injection of the silicon ions into the diffusion layer region is prevented by the silicon-oxide film 10 covering them.

Here, other materials such as germanium ions may be applied for making amorphous the poly-silicon layer for the gate electrode, and the thickness of the amorphous silicon layer 11 is preferably thicker than mean projection length of runs (Rp) of the injected ions for sufficiently preventing the channelling.

Figure 8:
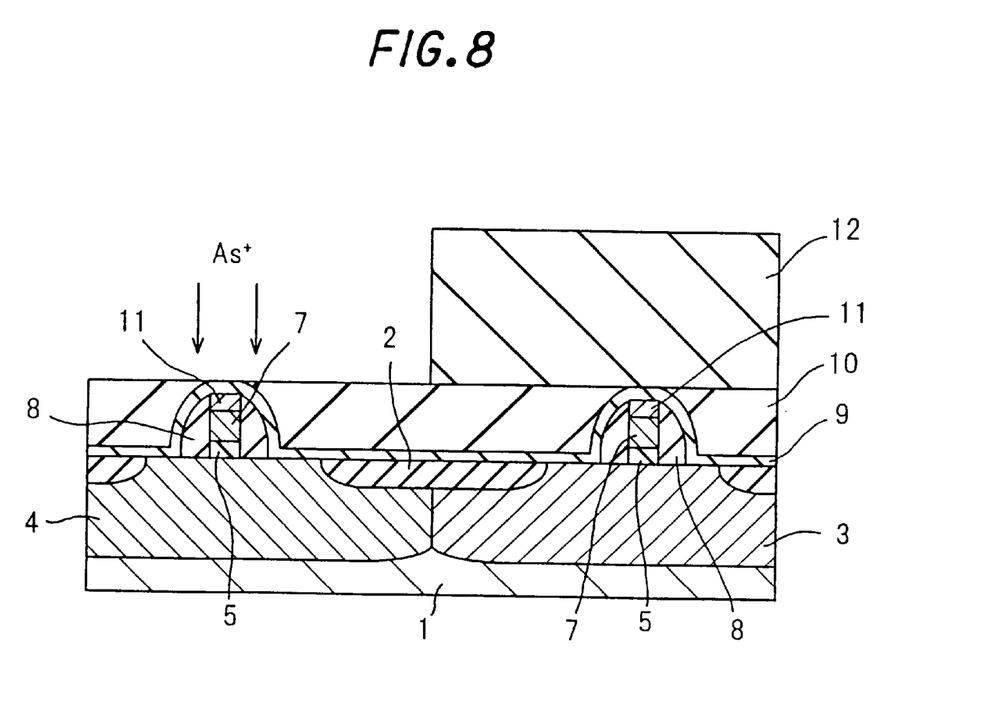

Then, covering pMOSFET area with a resist material 12 selectively by lithography technique, arsenic ions As+ are injected onto the gate electrode of nMOSFET with acceleration energy of 30 KeV and dose amount of 2.0E15/cm$^2$, as illustrated in FIG. 8. Here, the channeling is prevented by the amorphous layer 11 of the gate electrode surface, and the injected ions do not attain to the gate oxidation film 5 nor to the channel region.

By this process, the impurity injection into the gate electrode can be performed, and consequently, can be controlled separately from the impurity injection into diffusion layer regions which is performed by next process. Hence, depletion of the gate electrode can be easily prevented in the embodiment, realizing shallow junctions at the same time.

Figure 9:
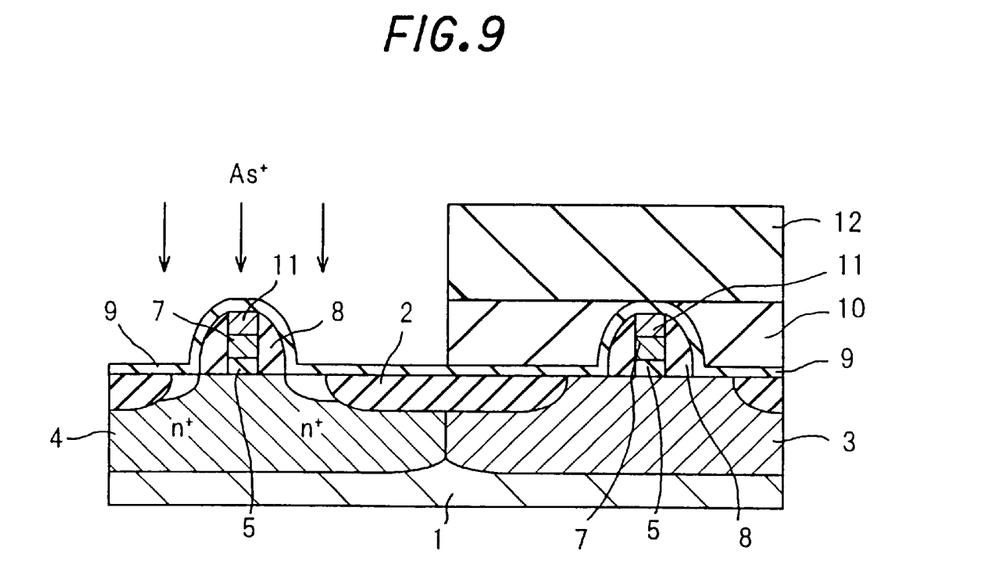

Then, as shown in FIG. 9, the silicon-oxide film 10 on the nMOSFET area is removed by dry-etching or wet-etching in order to expose the second silicon-nitride film 9 on the silicon substrate surface there, and arsenic-ion injection is performed again with acceleration energy of 30 KeV and dose amount of 2.0E15/cm$^2$, for forming source and drain electrode of the nMOSFET. Here also, the channeling is prevented by the amorphous layer 11 of the gate electrode surface, and the injected ions do not attain to the gate oxidation film 5 nor to the channel region. Hence, the dispersion of threshold voltage and the degradation of gate insulation film are both prevented, in the embodiment.

Figure 10:
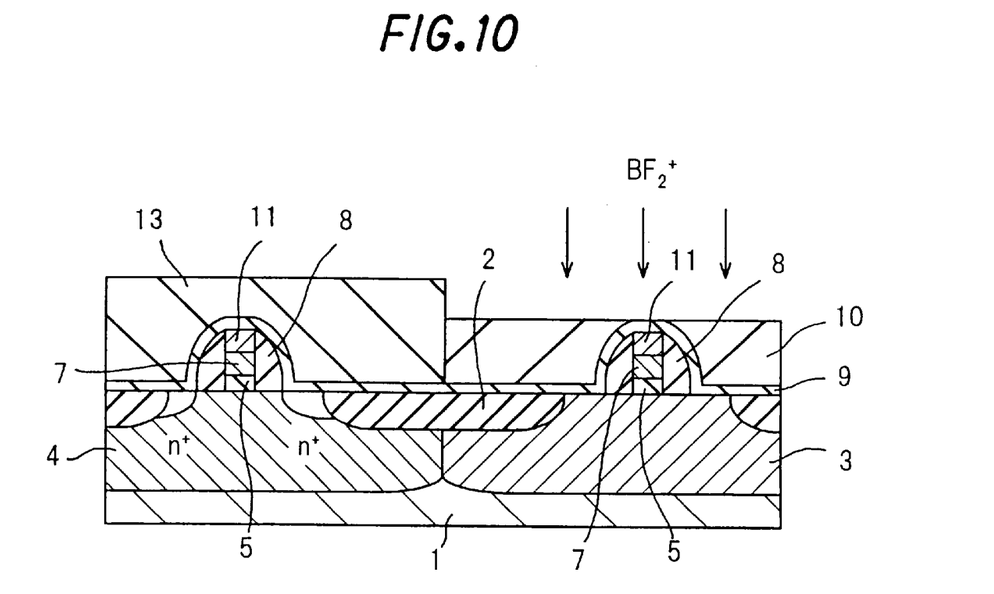

Then, covering the nMOSFET area with a resist material 13 in turn of the pMOSFET area as illustrated in FIG. 10, boron-fluoride ions BF$_2$+ are injected selectively onto the pMOSFET gate electrode with acceleration energy of 20 KeV and dose amount of 2.0E15/cm$^2$.

Figure 11:
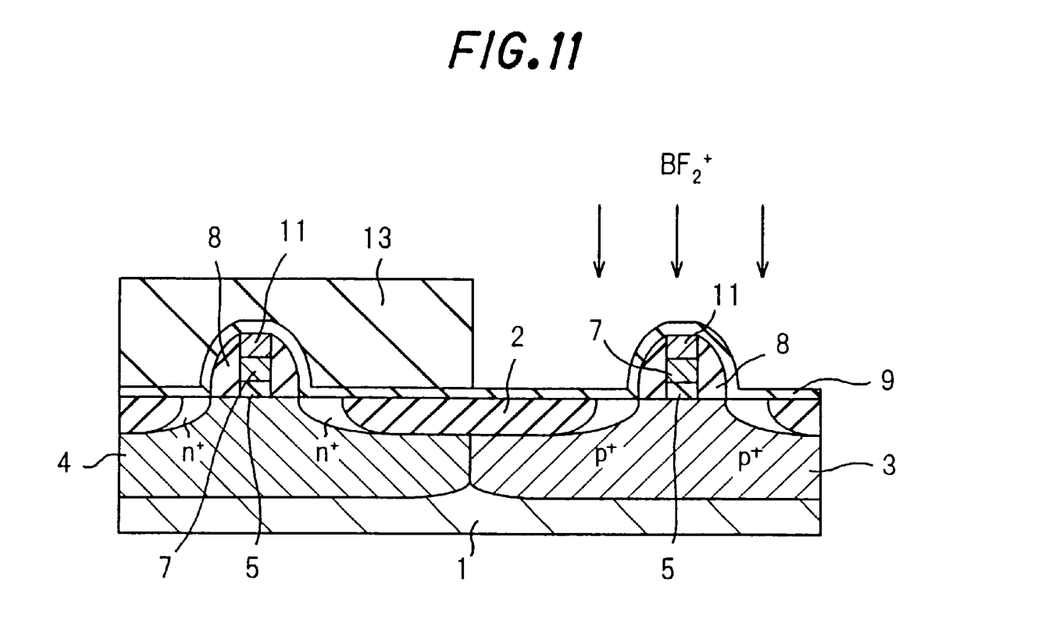

Then, as shown in FIG. 11, the silicon-oxide film 10 on the second silicon-nitride film 9 of the pMOSFET area is removed by etching, and boron-fluoride ion injection is performed again with acceleration energy of 20 KeV and dose amount of 2.0E15/cm$^2$, for forming source and drain electrode of the pMOSFET.

Figure 12:
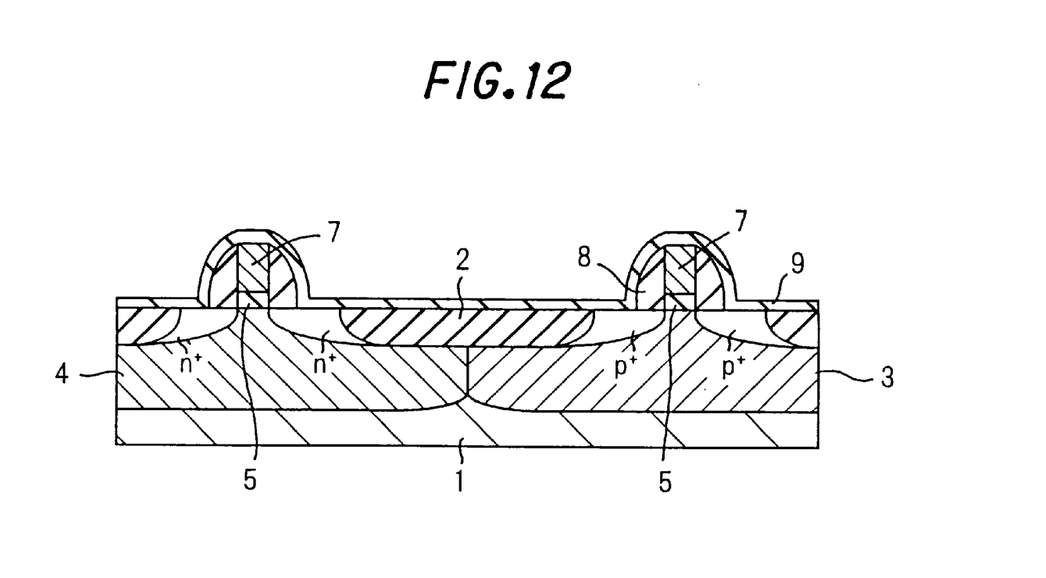

Then, after removing the resist material 13, a thermo-processing is performed for re-crystallizing the amorphous silicon-layers 11, and for making active ions injected into the gate, the source and the drain electrodes at the same time, in order to configure the CMOSFETs as illustrated in FIG. 12.

Thus, a desired semiconductor device is obtained according to the embodiment, by removing the silicon-nitride film 9, or providing interlayer insulation films, contacts, wiring films and so on, afterwards.

Now, a second embodiment of the invention is described referring to cross sections of FIGS. 13 to 17 illustrating fabrication processes of CMOSFETs according to another method.

Figure 13:
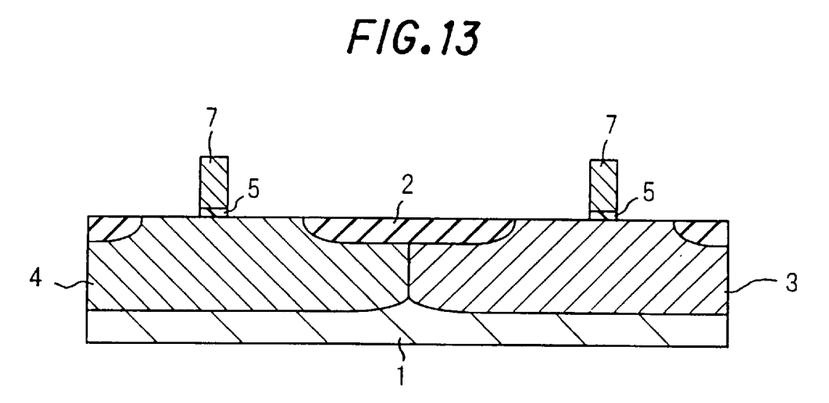
FIGS. 13 to 17 are cross sections illustrating fabrication processes of a pair of CMOSFETs according to a second embodiment of the invention.
Figure 14:
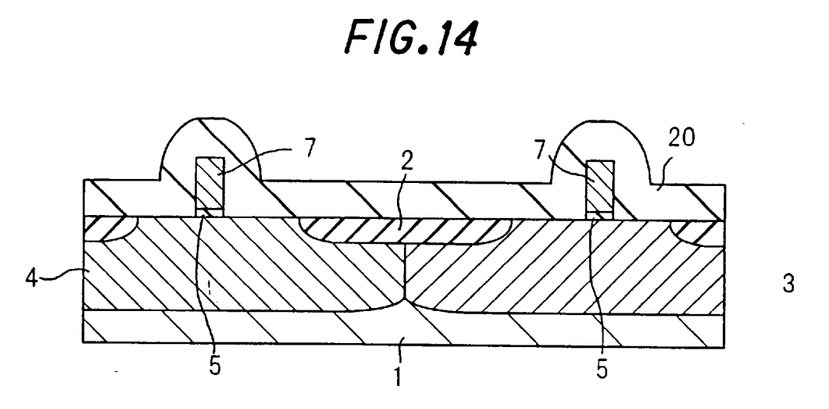

In the same way with the first embodiment as illustrated in FIGS. 1 to 3, the gate electrodes 7 are configured as shown in FIG. 13 from a poly-silicon film of 200 nm thickness on the substrate together with the gate insulation film 5. Then a silicon-nitride film 20 of 150 nm thickness is deposited covering them, as illustrated in FIG. 14.

Figure 15:
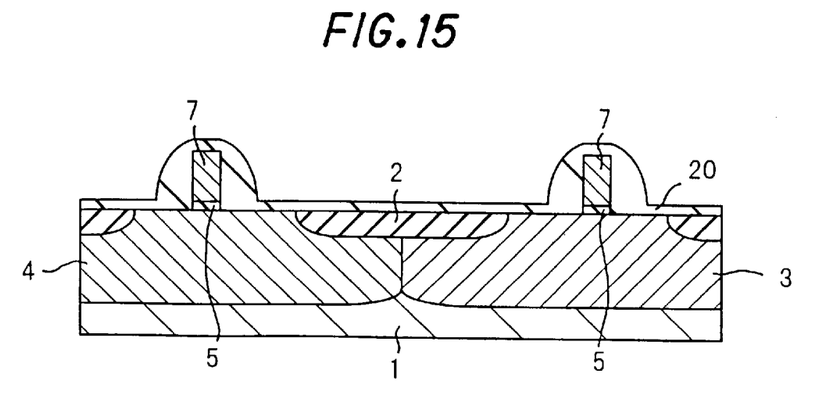
Figure 16:
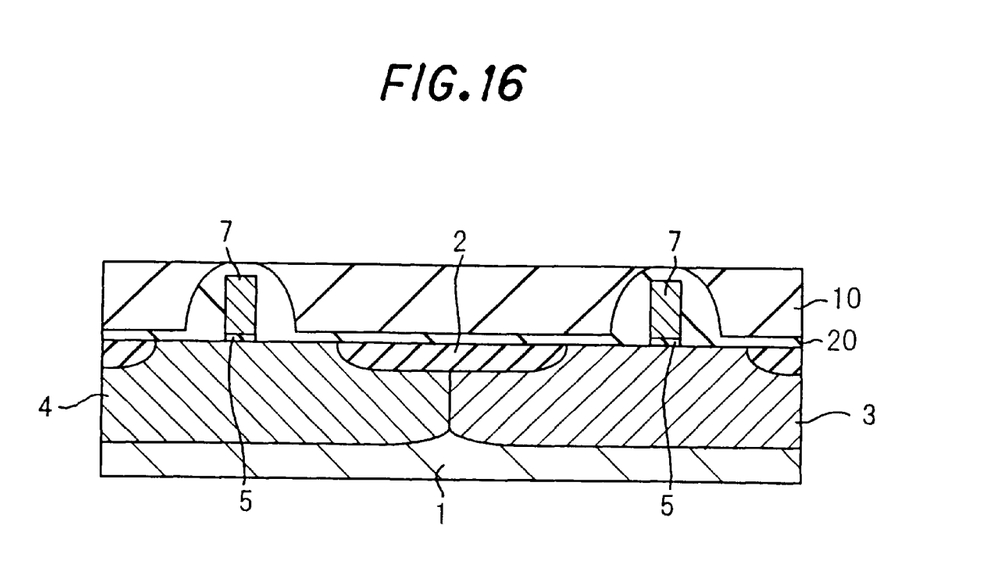

Then, the silicon-nitride film 20 is etched back by way of an anisotropic dry etching. In this process, a 10 nm thickness of the silicon-nitride film 20 is also left covering the field oxidation films 2 and the diffusion layer regions, as illustrated in FIG. 15. Then, a silicon-oxide film of 400 nm thickness is deposited and thinned out by CMP as illustrated in FIG. 16 for covering the substrate surface with the silicon-oxide film 10 leaving silicon-nitride film 20 of gate electrode regions exposed.

Figure 17:
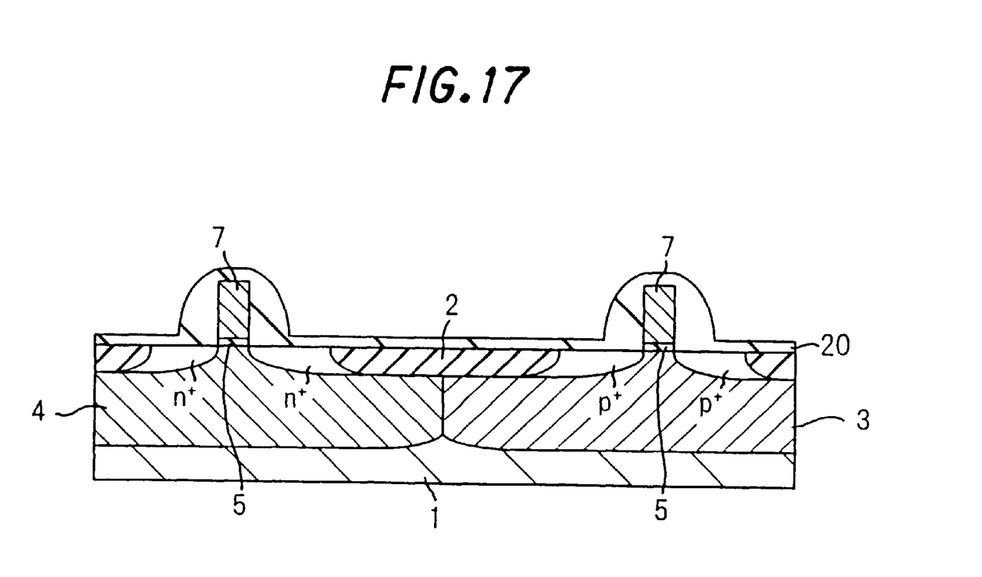
Figure 18A:
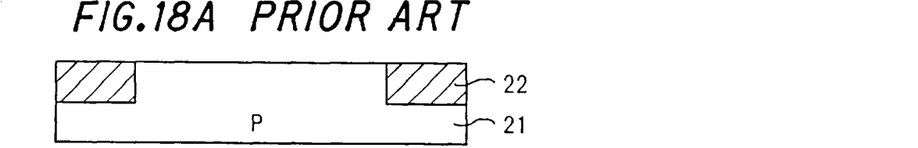
FIGS. 18A to 18E are cross sections schematically illustrating fabrication processes of a semiconductor device according to a prior art.
Figure 18B:
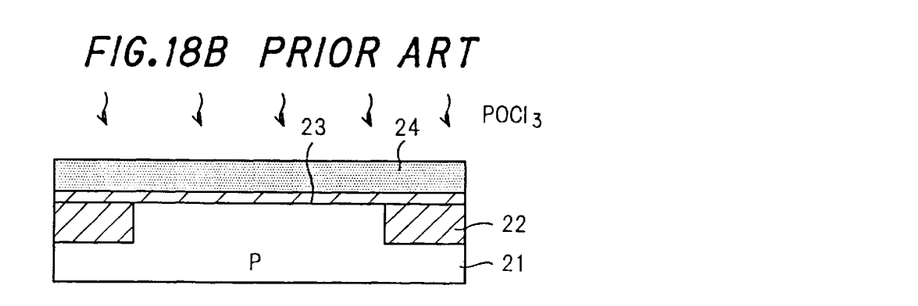
Figure 18C:
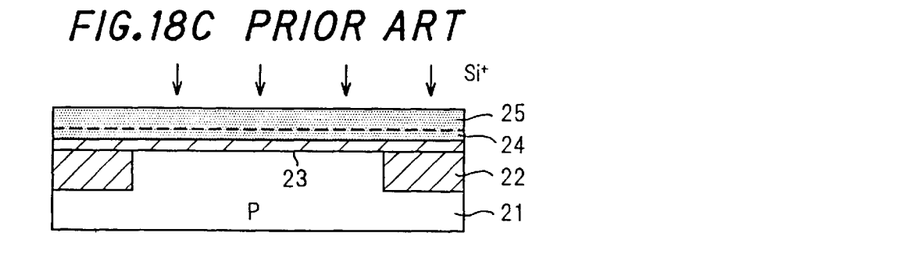
Figure 18D:
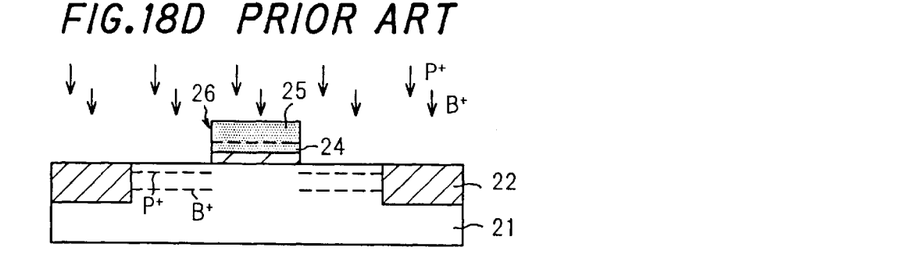
Figure 18E:
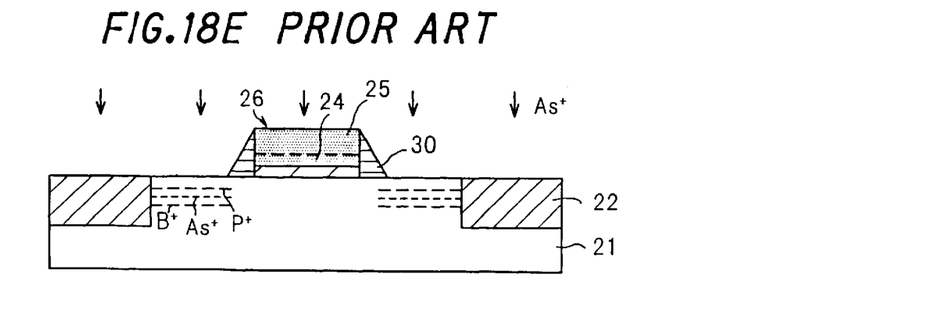

Then, following the same processes as described referring to FIGS. 9 to 11, CMOSFETs as illustrated in FIG. 17 are configured in the same way with the first embodiment, wherefrom the silicon-nitride film 20 other than the sidewall parts is etched back afterwards.

In the second embodiment, a deposition process of the second silicon-nitride film 9 on the field oxidation layers 2 and the diffusion layer region can be economized compared to the first embodiment. This is a merit of the second embodiment.

As heretofore described, the threshold voltage control does not become difficult because of the channelling provoked according to prior art when impurities are injected into gate electrode or source and drain diffusion regions, since the channelling is prevented in the invention by an amorphous silicon layer provided in a surface region of the gate electrode.

Further, the surface region of the gate electrode is made amorphous by silicon-ion injection performed selectively after the gate electrode is configured by patterning and surrounded by the sidewall. Therefore, the insulation film used for configuring the sidewall can be deposited even at a high substrate temperature, and so, uniform sidewalls independent of layout pattern can be configured, according to the invention, suppressing dispersion of drain current and threshold voltage caused in the prior art by dispersion of the effective channel length of the MOSFETs.

Still further, the impurity injection can be performed sufficiently into the gate electrode separately from the source and the drain diffusion layer regions without performing any additional masking process. Therefore, drain current suppression because of gate electrode depletion can be avoided as well according to the fabrication method of the invention.

What is claimed is:

1. A fabrication method of semiconductor devices comprising:
    a first ion injection step for making an amorphous surface region of a poly-silicon layer for a gate electrode configured on a semiconductor substrate by selectively injecting ions into the surface region, said first ion injection step being performed after the gate electrode is patterned and after a sidewall is formed around the gate electrode with an insulation film;
    a second ion injection step for injecting impurities into the gate electrode, said second ion injection step being performed after the first ion injection step, said second ion injection step being free of any process needing a high temperature of the semiconductor substrate.

2. The fabrication method recited in claim 1; further comprising:
    an insulation film configuration step performed before the first ion injection step for covering the semiconductor substrate with an insulation film leaving a surface of the gate electrode exposed; and
    a third ion injection step performed after the second ion injection step for injecting impurities into diffusion layer regions together with the gate electrode.

3. A fabrication method of semiconductor devices; comprising steps of:
    configuring a gate electrode on a semiconductor substrate;
    configuring a sidewall with an insulation film around the gate electrode;

configuring a silicon-nitride film on the semiconductor substrate together with the gate electrode surrounded by the sidewall;

configuring a silicon-oxide film on the silicon-nitride film, with a thickness more than a height of the gate electrode;

thinning out the silicon-oxide film so as to expose selectively the silicon-nitride film on a surface of the gate electrode;

making amorphous a surface region of the gate electrode by a first ion injection;

introducing first impurities into the gate electrode by a second ion injection;

removing the silicon-oxide film; and introducing second impurities giving the same conductivity with the first impurities into diffusion layer regions of the semiconductor substrate by a third ion injection for providing a source and a drain electrode.

4. A fabrication method of semiconductor devices; comprising steps of:

configuring a silicon-nitride film on a semiconductor substrate having a gate electrode formed thereon;

etching back the silicon-nitride film so as to leave the silicon-nitride film around the gate electrode and over diffusion layer regions of the semiconductor substrate for configuring a sidewall surrounding the gate electrode and a passivation film covering the diffusion layer regions and element separation regions of the semiconductor substrate;

configuring a silicon-oxide film on the silicon-nitride film, with a thickness more than a height of the gate electrode;

thinning out the silicon-oxide film so as to expose selectively the silicon-nitride film on a surface of the gate electrode;

making amorphous a surface region of the gate electrode by a first ion injection;

introducing first impurities into the gate electrode by a second ion injection;

removing the silicon-oxide film; and introducing second impurities giving the same conductivity with the first impurities into diffusion layer regions of the semiconductor substrate by a third ion injection for providing a source and a drain electrode.

5. The fabrication method recited in claim 3 wherein the step of thinning out the silicon-oxide film is performed by way of chemical mechanical polishing.

6. The fabrication method recited in claim 4, wherein the step of thinning out the silicon-oxide film is performed by way of chemical mechanical polishing.

7. The fabrication method recited in claim 1, wherein depth of the surface region made amorphous by the first ion injection is deeper than mean projection length of runs of injected ions.

8. The fabrication method recited in claim 3, wherein depth of the surface region made amorphous by the first ion injection is deeper than mean projection length of runs of injected ions.

9. The fabrication method recited in claim 4, wherein depth of the surface region made amorphous by the first ion injection is deeper than mean projection length of runs of injected ions.

10. The fabrication method recited in claim 1, wherein one of a silicon ion injection and a germanium ion injection is performed for the first ion injection.

11. The fabrication method recited in claim 3, wherein one of a silicon ion injection and a germanium ion injection is performed for the first ion injection.

12. The fabrication method recited in claim 4, wherein one of a silicon ion injection and a germanium ion injection is performed for the first ion injection.

* * * * *